(12) United States Patent
Mankos et al.

(10) Patent No.: US 6,724,002 B2
(45) Date of Patent: Apr. 20, 2004

(54) MULTIPLE ELECTRON BEAM LITHOGRAPHY SYSTEM WITH MULTIPLE BEAM MODULATED LASER ILLUMINATION

(75) Inventors: Marian Mankos, San Francisco, CA (US); Steven T. Coyle, Alameda, CA (US); Andres Fernandez, Dublin, CA (US); Allan L. Sagle, Berkeley, CA (US); Paul C. Allen, Beaverton, OR (US); Xiaolan Chen, Beaverton, OR (US); Douglas Holmgren, Portland, OR (US); Windsor Owens, San Francisco, CA (US); Jeffrey Sullivan, Berkeley, CA (US); Tim Thomas, Portland, OR (US); Mark A. Gesley, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/055,121

(22) Filed: Jan. 22, 2002

(65) Prior Publication Data

US 2003/0042434 A1 Mar. 6, 2003

Related U.S. Application Data

(60) Provisional application No. 60/265,272, filed on Jan. 31, 2001.

(51) Int. Cl.[7] ............................................. H01J 40/16
(52) U.S. Cl. ..................... 250/492.24; 250/492.23; 250/492.224; 250/492.2
(58) Field of Search .......................... 250/491.1, 492.2, 250/442.22, 492.23, 492.3, 492.24, 423 P, 311, 396 ML; 359/285; 313/373, 523; 372/22, 26, 27; 332/117

(56) References Cited

U.S. PATENT DOCUMENTS

| | | | |
|---|---|---|---|
| 3,927,320 A | * 12/1975 | Chatfield et al. | 250/307 |
| 4,460,831 A | * 7/1984 | Oettinger et al. | 250/492.2 |
| 4,788,514 A | 11/1988 | Fox | 332/7.51 |
| 5,038,072 A | 8/1991 | Beghin | 313/370 |
| 5,039,862 A | * 8/1991 | Smith et al. | 250/423 P |
| 5,359,451 A | 10/1994 | Gelbart et al. | 359/285 |
| 5,386,221 A | * 1/1995 | Allen et al. | 347/239 |
| 5,533,170 A | 7/1996 | Teitzel et al. | 395/108 |

(List continued on next page.)

FOREIGN PATENT DOCUMENTS

| WO | WO 98/48443 | 10/1998 |
|---|---|---|
| WO | WO 99/03016 | 1/1999 |
| WO | WO 99/03022 | 1/1999 |
| WO | Wo 99/47978 | 9/1999 |
| WO | WO 0213226 | * 2/2002 |

OTHER PUBLICATIONS

Kong et al., Cesium Telluride Photocathodes, J.Appl.Phys., Jun. 1995.

Dinh et al., Synthesis and Characterization of SI/Cs/O nanocluster thin films with negative electron affinity, Phys-.Review 1999.

*Primary Examiner*—John R. Lee
*Assistant Examiner*—James P. Hughes

(57) ABSTRACT

An electron beam lithography system includes a laser for generating a laser beam, and a beam splitter for splitting the laser beam into a plurality of light beams. The intensity of the light beams is individually modulated. The light beams are of sufficient energy such that, when they impinge on a photocathode, electrons are emitted. Modulation of the light beams controls modulation of the resulting electron beams. The electron beams are provided to an electron column for focusing and scanning control. Finally, the electron beams are used to write a scanning surface, for example, using an interlaced writing strategy.

12 Claims, 6 Drawing Sheets

U.S. PATENT DOCUMENTS

| | | | |
|---|---|---|---|
| 5,684,360 A | 11/1997 | Baum et al. | 313/542 |
| 5,729,022 A | 3/1998 | Veneklasen et al. | 250/396 |
| 5,814,821 A | 9/1998 | Reusch et al. | 250/492.3 |
| 5,831,272 A * | 11/1998 | Utsumi | 250/492.2 |
| 5,960,013 A * | 9/1999 | Sheffield | 372/2 |
| 6,014,200 A * | 1/2000 | Sogard et al. | 250/492.3 |
| 6,054,713 A * | 4/2000 | Miyake et al. | 250/492.24 |
| 6,448,568 B1 * | 9/2002 | Allen et al. | 250/492.24 |

* cited by examiner

US 6,724,002 B2

MULTIPLE ELECTRON BEAM LITHOGRAPHY SYSTEM WITH MULTIPLE BEAM MODULATED LASER ILLUMINATION

CROSS REFERENCE TO RELATED APPLICATIONS

The present application claims priority from U.S. Provisional Application Serial No. 60/265,272, filed Jan. 31, 2001, which is hereby incorporated by reference in its entirety as if fully set forth herein.

BACKGROUND OF THE INVENTION

1. Field of the Invention

The present invention relates to electron beam lithography systems and, in particular, to a multiple beam system with modulated laser illumination.

2. Description of the Related Art

Electron beam lithography systems generally include an electron source and electron optics for accelerating the electrons into an electron beam and focusing the electrons onto a target, thereby exposing a mask (reticle) or wafer. In a conventional electron beam lithography system, a single beam in a single column is used to expose the resist and create the desired pattern.

The throughput of a conventional lithography system is limited by the total beam current: as the total beam current is increased, electron—electron interactions in the beam cause excessive blur, resulting in a degradation of the resolution in the written pattern. Several approaches are known to reduce electron—electron interactions and the associated beam blur. If the total current is distributed evenly among several beams, a reduction of the beam blur in each column results in higher resolution, and if all beams are operated in parallel, the throughput is not compromised. In addition, the clock rate of each individual beamlet is reduced by a factor equal to the number of beamlets, thus reducing the blanking rate for each beamlet significantly. This is impractical for a conventional column due to its overall dimensions and large footprint.

However, in a single electron beam column, the total current can be divided into several beamlets, which also reduces the blur due to electron—electron interactions and therefore allows a higher total beam current. Single beam-beamlet lithography systems are the patterned photocathode approach described in U.S. Pat. No. 5,684,360, "Electron source utilizing negative electron affinity cathodes with ultrasmall emission areas", the gated electron emitter photocathode approach, described in WO9950874A3, or the VCSEL array approach described in co-pending U.S. patent application Ser. No. M-7958).

SUMMARY OF THE INVENTION

These and other drawbacks in the prior art are overcome in large part by an electron beam lithography system in accordance with the present invention.

The electron beam lithography system includes a laser for generating a laser beam, and a beam splitter for splitting the laser beam into a plurality of light beams. The intensity of the light beams is individually modulated. The light beams are of sufficient energy such that, when they impinge on a photocathode, electrons are emitted. Modulation of the light beams controls modulation of the resulting electron beams. The electron beams pass through an electron column for focusing and scanning control. Finally, the electron beams are used to write while scanning across a surface, for example, using an interlaced writing strategy.

In one implementation, a high throughput lithography system includes an electron beam column with a photocathode illuminated by an array of individually blanked laser beams in which the intensity of the individual laser beams is modulated or varied by one or more acousto-optical modulators. In particular, an argon-ion laser with a beam splitter and array of acousto-optic modulators in combination with a photocathode and 50 keV electron beam column is employed.

BRIEF DESCRIPTION OF THE DRAWINGS

A better understanding of the invention is obtained when the following detailed description is considered in conjunction with the following drawings in which.

DETAILED DESCRIPTION OF THE INVENTION

System Overview

Figure 1:
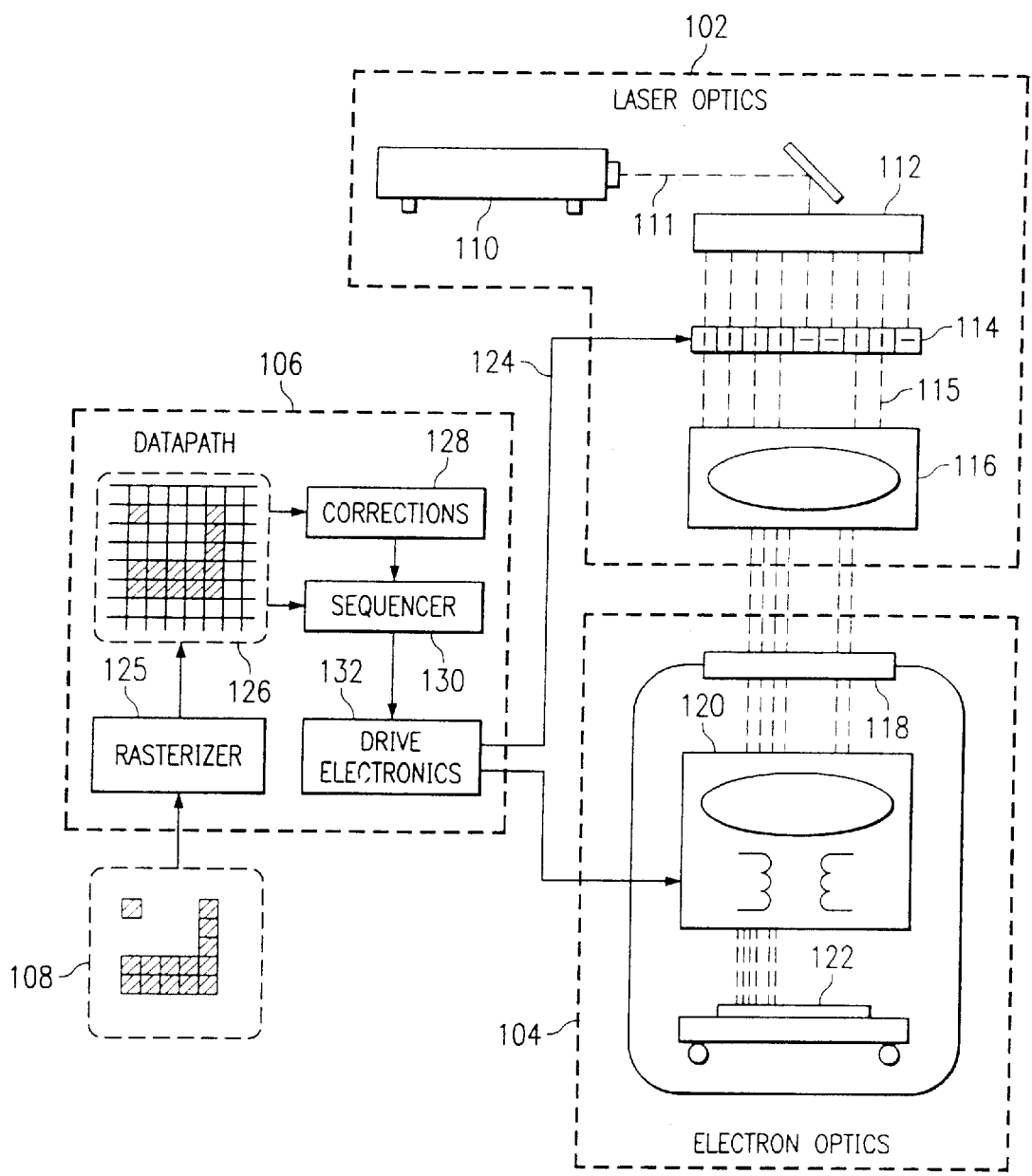
FIG. 1 is a block diagram of an exemplary electron beam lithography system in accordance with an implementation of the invention.

Turning now to FIG. 1, a block diagram of an electron beam lithography system according to an implementation of the present invention is shown and generally identified by the reference numeral 100. As shown, the system 100 includes laser optics 102, electron optics 104, and an electronics datapath 106, which receives an input 108.

The laser optics 102 include a laser 110, beam splitter 112, one or more modulators 114, such as acousto-optical modulators, and an optical system 116. In one implementation, the laser 110 is a 257 nm argon-ion laser. The electron optics 104 include a photocathode 118, an electron beam column 120, and a writing plane 122, as will be explained in greater detail below.

The datapath 106 includes a rasterizer 125, which produces a sampled image 126, corrections unit 128, sequencer 130 and drive electronics 132. An exemplary rasterizer is described in commonly-assigned U.S. Pat. No. 5,533,170, titled "Rasterizer for a Pattern Generation Apparatus," which is hereby incorporated by reference in its entirety as if fully set forth herein.

In operation, a laser beam 111, generated by the laser 110, is split into a plurality of individual laser beams using the beam splitter 112. In one implementation, the laser beam 111 is split into 32 beams by the beam splitter 112. The array of individual laser beams enters the array of acousto-optic modulators (AOM) 114, which switch on or off or set the transmitted photon flux of each individual beam to a predetermined value. In one implementation, thirty-two (32) AOMs are provided.

The data needed to drive the AOMs are provided from the datapath 106 and, particularly, the rasterizer 125. That is, the switching of the AOMs 114 is controlled by a modulation signal 124, provided from the drive electronics 132 of the datapath 106. The modulation signal is determined by the pattern to be exposed on the substrate and generated by the datapath 106.

Beam blanking and modulation is implemented electronically at the AOM array level, which significantly simplifies the design of the electron lithography system. The resulting shorter column minimizes the electron—electron interactions and maximizes achievable throughput. In the AOM array 114, the modulation of the photon intensity is achieved by applying RF power to the individual AOM channels. Applying different levels of RF power can be used for fine modulation of the photon intensity. A multiple gray level, multiple pass writing strategy may be used for this electron lithography system. Further, another AOM (not shown) may be inserted in the optical system upstream of the splitter to act as a fast auxiliary blanker. This additional AOM may be used during scan retrace when additional blanking is needed but the shutter 208a (FIG. 2) is too slow.

Individual photon beams 115, generated by the AOM array 114, are demagnified by the optical system 116. The optical system 116 may be implemented as one or more optical lenses focused on the photoemitting surface of a photocathode 118.

Examples of a suitable photocathode are $Cs_2Te$ (cesium telluride) photocathodes, Mg (magnesium), negative electron affinity photocathodes, based for example on cesiated GaAs (gallium arsenide), cesiated GaN (gallium nitride), or silicon-cesium oxide nanoclusters and possibly gold with a covering of hydrocarbons. In operation, photons absorbed in the photocathode layer 118 excite electrons above the vacuum level, and a portion of the electrons which do not lose enough energy (while scattering in the photocathode layer itself) are emitted into vacuum. When a voltage (up to 50 kV) is applied to the extraction electrode, the photoelectrons are accelerated and focused to form a multibeam pattern, i.e. a virtual image of the photocathode surface, which is a demagnified photoemission image of the laser beam array. The electron beam column 120 then demagnifies the multibeam pattern and scans it across the writing plane 122.

Throughput Considerations

System throughput may be an important factor in a multisource system. A first factor affecting throughput is the total current needed to pattern a substrate. A certain fraction of the electron-sensitive resist must be exposed. To a first approximation, this exposure requires a maximum available electron dose, which can be calculated for a resist of given sensitivity. The throughput is determined by the time required to deliver this dose, which is proportional to the maximum total electron current. This total current is proportional to the number of beamlets $N_b$ and the current $I_b$ delivered by each beamlet. Thus the time T to expose a given area is $T=AS/N_bI_b$, where A is the area to be patterned and S is the resist sensitivity (charge density required to expose the resist). High throughput can be achieved by using a sufficiently large number of beamlets and a sufficiently large current in each beamlet.

A second factor affecting throughput is pixel delivery rate. To compose the pattern properly, the pixel spacing d must be not much more than half the size of the smallest pattern features. The total number of pixels, $\Sigma n$, will be proportional to $A/d^2$, so the time required to write the pattern is $T=A/f N_b d^2$, where f is the maximum beam incrementing rate. This time can be reduced by using a large number of beams and a high modulation rate. Because of the large number of pixels involved, the imodulation rate required for a single beam system quickly exceeds the commonly accepted state of the art (300–500 MHz). For a given throughput, multiple beam approaches reduce the modulation rate by the number of beamlets used.

A third factor affecting throughput is that the stage acceleration and velocity must be matched to the electronic scan length. As the array of beams is scanned across the substrate, the area under each electronic scan is given by $LN_bd$, where L is the length of the electronic scan. The number of scans n needed to cover the entire area A is therefore $n=A/(LN_bd)$. In a write-on-the-fly scheme with a continuously moving stage, the time $T_s$ to travel from one scan line to the next is $T_s=N_bd/v$, where v is the stage velocity. The time required to cover an entire substrate (ignoring all overheads such as acceleration, deceleration, and retrace times) is $T=T_sn=A/Lv$, where the larger scan length L allows for increased throughput.

For a high-throughput multisource column, a large array of beamlets with a large current in each beamlet, a high modulation frequency, and a large scan field are desirable. For direct-write applications, a throughput of 10 (300 mm) wafers/hour may be achievable with a resist sensitivity of 10 $\mu C/cm^2$ and a 50 keV multisource lithography column with a total beam current of 16 $\mu A$. The array would contain 200 beamlets individually switching at 300 MHz and scanned over a field of 1 mm, while the stage moves at a speed of 15 cm/sec. For mask patterning applications, where the throughput is reduced to one 9 inch mask/6 hours, a column with 32 beams, total beam current of less than 1 $\mu A$, scan field of 0.6 mm, blanking rate of 100 MHz and stage speed of less than 1 cm/sec are sufficient.

Laser Optics

Figure 2:
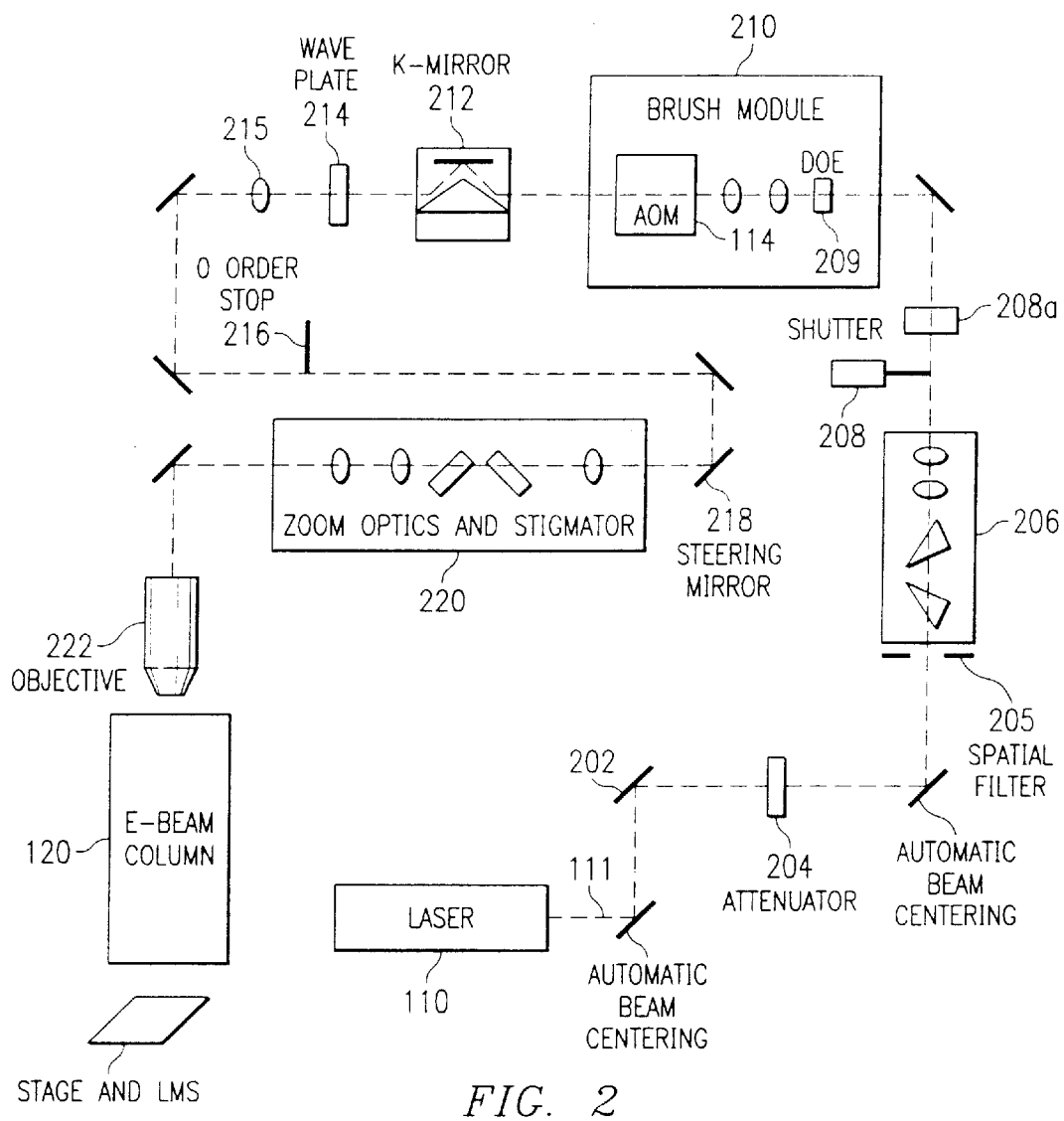
FIG. 2 is a more detailed diagram of the laser optics of FIG. 1.

A more detailed diagram of the laser optics 102 (FIG. 1) is shown in FIG. 2. The beam 111 from the 257 nm laser is actively controlled by automatic beam centering mirrors 202 so that alignment to the optical train, both in position and angle, is maintained. An attenuator 204, a combination polarization rotating element and polarizing beam splitter, adjusts the laser power to a range suitable for operation of the system while allowing the laser to operate in a power range optimized for reliability and light noise control. A spatial filter 205 removes the lobes from the sine squared intensity profile caused by the frequency doubling crystal inside the laser. Anamorphic relay optics 206 create a round beam from the radiation exiting this aperture and relays it to a diffractive optical element (DOE) 209 inside the brush module 210.

The DOE 209 is a grating that produce 32 beams that are focused by the lenses inside the brush module to waists under the transducers of the multi-channel AOM 114. The AOM 114 diffracts part of the light from each beam in response to the RF signal applied to each channel. The intensity of the diffracted beam can be adjusted by the power level of the RF signal thus allowing for separate gray scale modulation of each channel.

A mechanical shutter 208 before a brush module 210 is used to block all light from reaching the photocathode when the system is not writing. A blanker AOM 208a may be provided for blanking during scan retrace. A K-mirror 212 allows for rotational adjustment of the linear array of beams exiting the AOM. A wave plate 214 aligns the polarization of the beams for optimal focusing through birefringent photocathode substrates such as sapphire. A lens element 215 after the wave plate 114 focuses the array onto an afocal spot on the steering mirror. Before reaching the steering mirror, the zero order or undiffracted, light from the AOM is blocked by the 0 order beam stop 216. A steering mirror 218 allows for small positional adjustment of the spot array at the final image plane of the objective. The zoom optics and stigmator 220 relay the focal spot into the pupil of the objective lens 222. Tilted plates inside the stigmator provide adjustment capability to ensure that the focus of the spots on the photocathode substrate occurs in the same plane whether measured along the direction of the array of spots or perpendicular to it. Movable lenses within the zoom allow for slight magnification adjustment of the array. According to one implementation of the present invention, the objective 222 has a NA of 0.57 and presents a 300 nm FWHM spot to the photocathode material.

Table 1 shows how the array of 32 beams is demagnified throughout the system. The 42 um spot size inside the AOM 114 gives a 7 ns sound transit time in the fused silica interaction medium. A 300 MHz carrier frequency is used to diffract the beams with a 10 nsec pixel time. The 42 um spot size in the AOM is reduced to 300 nm at the photocathode by the optical train. This includes spot enlargement from 225 nm to 300 nm caused by aberrations in the optical train. This spot size is further reduced by the electron optics to 50 or 70 nm depending on the electron column demagnification. This also contains some allowance for spot enlargement from e-beam aberrations.

Near the optical axis 301, the resolution of the virtual image formed by the accelerating field is limited by the spherical and chromatic aberration. For emission sites at the photocathode further away from the optical axis, the electron-optical image can suffer from off-axis aberrations, which can severely limit the available field size at the photocathode and therefore limit the maximum array size. A large photoemission area allows increased separation between beamlets, which reduces the effect of electron—electron interactions. For such large photoemission areas, an additional electron (field) lens 306, in close proximity to the photocathode 118, is used in order to minimize off-axis aberrations in the following demagnification lenses. Further details of exemplary electron optics are shown in U.S. Pat. No. 6,215,128, titled A COMPACT PHOTOEMISSION SOURCE, FIELD AND OBJECTIVE LENS ARRANGEMENT FOR HIGH THROUGHPUT ELECTRON BEAM LITHOGRAPHY, and WO055690A2, which is hereby incorporated by reference in its entirety as if fully set forth herein. The field lens 306 collimates the electrons exiting the accelerating region and forms a crossover in the plane of the beam-limiting aperture. The virtual image created by the field lens is then subsequently demagnified by the demagnification and objective (magnetic) lenses 310, 314 (FIG. 3) to form a array of focused beams. A set of alignment coils 309 is used to center and stigmate the electron beam array in the beam-limiting aperture and in the objective lens.

According to one implementation of the invention, a set of multiple stage deflection coils 312 is used to scan the array of individually blanked beamlets across the substrate, and another set of deflection coils performs dynamic stig-

TABLE 1

Brush parameters through the optical and e-beam sub-systems. All spot sizes are full width half maximum.

| Parameters | At Plate Low res./high res. | At Photocathode Low res./high res. | At AOM Low res./high res. |
|---|---|---|---|
| Unaberrated beam dia. | 50 nm/30 nm | 225 nm | 42 $\mu$m |
| Aberrated beam dia. | 70 nm/50 nm | 300 nm | 42 $\mu$m |
| Beam separation | 350 nm/210 nm | 2.10 $\mu$m | .392 mm |
| Brush width | 10.85 $\mu$m/6.51 $\mu$m | 65.1 $\mu$m | 12.152 mm |
| Demag from previous stage | 6.0/10 | 186.66. . . | NA |
| Stripe brush increment | 1600 nm/960 nm | NA | NA |
| Filled-in grid | 25 nm/15 nm | NA | NA |

Electron Optics

Figure 3:
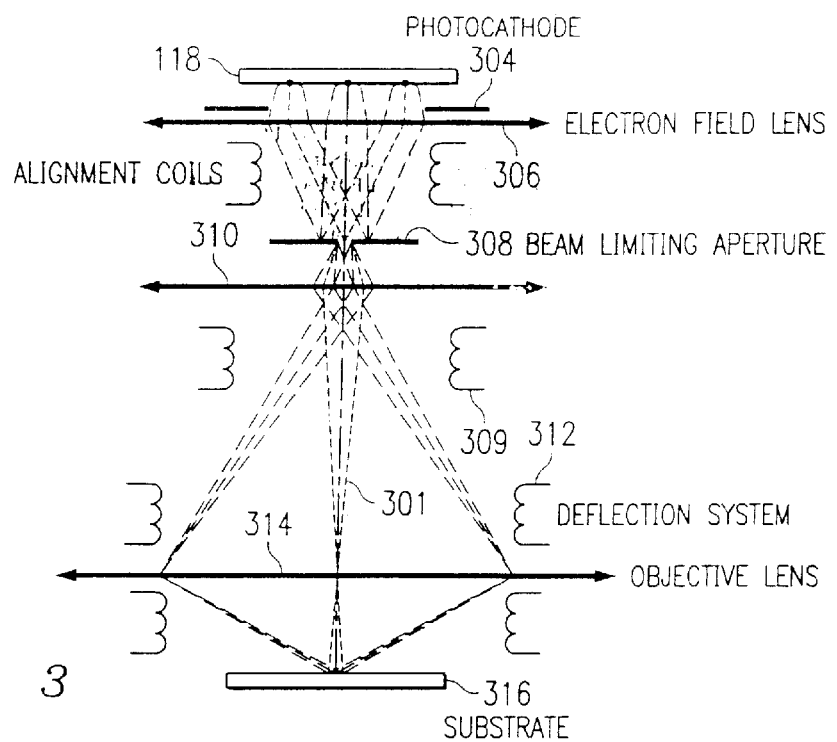
FIG. 3 and FIG. 4 illustrate electron optics for the system of FIG. 1.
Figure 4:
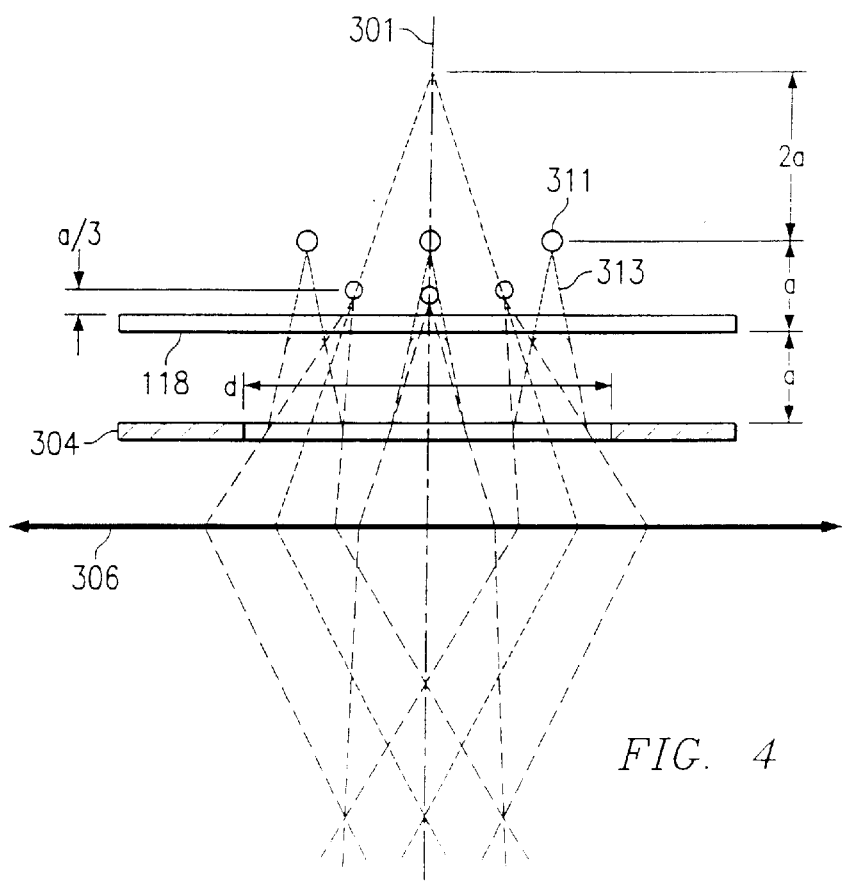

Exemplary electron optics are shown in greater detail in FIG. 3 and FIG. 4. In operation, an array of laser beams exiting the AOM array 114 (FIG. 1) is focused on the photoemissive layer of a planar photocathode 118 (FIG. 1, FIG. 4). The photocathode 118 is placed in a strong extraction field, typically 5–10 kV/mm in order to minimize axial aberrations.

In the embodiment illustrated, the photocathode 118 is biased at −50 kV, and is separated from a grounded extraction electrode (anode) 304 by an accelerating gap a (FIG. 4). The extraction electrode 304 is typically a planar electrode with an aperture of diameter d in the center. The accelerating field forms a 1× magnified virtual image 311 of the photocathode surface at a distance a above the photocathode surface, and the divergent lens action of the aperture forms a demagnified (⅔×) virtual image 313 at a distance a/3 above the photocathode. Simultaneously, this aperture lens shifts the plane of the virtual source of illumination to a plane spaced a distance of 3a above the photocathode 118.

mation and focus as the array is scanned across the full field. This allows dynamic stigmation and focus corrections to be applied to different parts of the scan field. X and y deflection corrections can also be added to different parts of the scan field The beams inside the AOM 114 must be spread out so that there is no optical interference or acoustic crosstalk between them. However, the final integrated image in resist must be composed of overlapping spots. This is accomplished by employing an interlaced scan print strategy and writing with multiple passes, as will be described in greater detail below.

Electron Optics—Photocathode

Another important factor to be considered in the optical design is the electron emission properties of the photocathode. These properties need to be closely matched to the electron-optical parameters of the column. Key photoemission parameters, i.e., source size, angular and energy distributions of photoemitted electrons, and photocathode quantum efficiency (QE), are critical for determining the column geometry and related laser optical design parameters. Photocathodes with high quantum efficiency, low transverse energy spread, low noise, high stability, and long lifetime are desirable.

Electrons are emitted from the photocathode surface into vacuum in all directions, in a full solid half-angle with a specific angular and energy distribution.

Figure 10:
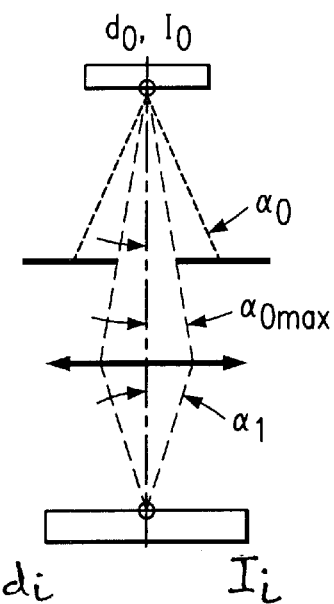
FIG. 10 is a simplified optical diagram of a lithography column according to an embodiment of the present invention.

When a voltage is applied to the extractor, the electrons are accelerated and collimated by the extraction electrode into a narrow cone defined by the source half-angle $\alpha_o$ and then focused by one or more lenses at the substrate plane, as shown in FIG. 10. The source half-angle $\alpha_o$ determines the brightness of the source and therefore affects the column design and system architecture of the tool.

The optimum image acceptance angle $\alpha_i$ determined by the tradeoff between objective lens aberrations and e—e (electron—electron) interactions, is typically 10 mrad or less. For smaller image acceptance angles $\alpha_i$, the blur due to geometric and chromatic aberrations decreases, but e—e interactions increase. For image acceptance angles larger than 10 mrad, the e—e aberrations decrease, however the geometric and chromatic aberrations can become excessive.

Assuming that the lenses have a demagnification M (M<1), the angular magnification $M_\alpha=1/M$ and therefore the maximum source angle $\alpha_{0max}$ that can be accepted by the column is $\alpha_{0max}=\alpha_i/M_\alpha$. The required demagnification ratio is set by the achievable photoemission source size, which is determined by the laser spot size and required beam spot size at the substrate. For example, for a laser spot of 0.5 μm and a required beam spot size of 70 nm at the substrate, the accelerating region demagnifies the spot by ⅔, and a demagnification ratio of 10× (M=0.1) is required when electron optical aberrations of the electron lenses are included. At this demagnification ratio, and for $\alpha_i$=10 mrad, the maximum accepted source angle $\alpha_0$=1 mrad. When the source angle $\alpha_0$ is larger than $\alpha_{0max}$, a fraction of the beamlet current must be cut out by the beam limiting aperture, and only a fraction T (here T can be thought of as a transmission coefficient), where T=$(\alpha_{0max}/\alpha_0)^2$, can be used for beam exposure.

In summary, for maximum efficiency, one can reduce the magnification M to increase the maximum source angle $\alpha_{0max}$ or decrease the source angle $\alpha_0$. Typically, $\alpha_0 > \alpha_{0max}$, which means that some percentage of photoemitted electrons are lost. The source angle $\alpha_0$ depends on the beam energy E, the energy spread, and angular distribution of photoemitted electrons. For a given photocathode, this angle varies with accelerating voltage as $$\alpha_0 = \sqrt{\frac{\Delta E_{tr}}{E}}$$

where $\Delta E_{tr}$ is the transverse energy spread. For a gold photoemitter illuminated with a 257 nm laser, the energy spread is estimated to be about 0.5 eV, which corresponds to a source angle $\alpha_0$ of 3.2 mrad at 50 keV. The transmission coefficient T is then 0.1, i.e., only 10% of the generated photoelectrons can be used to expose the substrate. This means that significantly more laser power is needed to generate the current required at the substrate. Ideally, one would like to minimize the transverse energy spread and simultaneously maximize the quantum efficiency. The laser power P needed to generate the required source current $I_0$ equals P=$I_0/\eta$, where η is the quantum efficiency, which near the threshold in Fowler's approximation is proportional to $$\eta \propto (h\nu-\Phi)^2 \propto (\Delta E)^2$$

where hν is the photon energy, φ is the work function of the photocathode, and ΔE is the energy spread. For a given laser photon energy hν and work function φ, the requirement for a maximum photocurrent and minimum energy spread can be restated as finding a photocathode with the steepest (largest slope) dependence of quantum efficiency upon photon energy.

The optical parameters of the laser, electron optics, and source are closely related. Assume a simplified column (FIG. 10), where the laser generated source has a diameter of $d_0$ and total source current of $I_0$. The photoemitted electrons are emitted into a solid angle $\alpha_0$. At the substrate, an image current $I_i$, and a beam diameter $d_i$, are required to meet the lithography print quality and throughput. The magnification M of the column is defined as M=$d_i/d_0$, i.e., $M_\alpha = d_0/d_i = \alpha_i/\alpha_{0max}$ and the source and image currents are related by $I_i$=T$I_0$. When aberrations are neglected, the brightness $\beta_i$ is conserved in the imaging process. The source current density $J_0$ at the photocathode can be written as $J_0 = J_i M^2/T$, where M is smaller than 1. $J_0$ is a constant because $M^2/T = (\alpha_i/\alpha_0)^2$ is a constant for a given optimized objective lens and particular photocathode material, and $J_i$, is determined by throughput requirements. Assuming that lithographic print quality and throughput require a spot size of 50 nm and beamlet current of 20 nA, a current density of about 1000 A/cm² will be needed at the substrate.

For an image acceptance angle of 10 mrad, the required beam brightness at the substrate is >3×10⁶ A/cm²sr, and therefore a photocathode brightness of about 10⁷ A/cm²sr is desirable. For a demagnification of M=0.1 and a column transmission T=0.1, a current density of about 100 A/cm² must be delivered by the photocathode. The required high current density can cause significant photocathode degradation due to electron- and photon-stimulated desorption and chemistry at the photocathode surface and surrounding surfaces.

For conventional metal photocathodes, i.e., gold, silver, etc., the quantum yield and photoyield (nA/mW) are quite low even for UV light. A stable, high power UV laser is needed to provide sufficient beam current. For example, for a gold photoemitter with a photoyield of 10 nA/mW, a total power of 20 mW is needed to generate a beamlet current of 200 nA at the source, which is then reduced by the beam-limiting aperture to a current of 20 nA/beamlet at the substrate.

For 32 beams, a total laser power of 640 mW is needed, which has become recently available in the most powerful UV lasers. When the laser power utilized in each beamlet is focused into a 0.5 μm spot, a laser power density of ~2×10⁷ W/cm² is reached at the photocathode surface. The required high laser power and small spot sizes result in very high power densities, which can cause significant photoyield degradation due to photon-induced surface effects, i.e., photodesorption and photon-stimulated surface chemistry.

In addition, a significant increase in temperature can be expected for low thermal conductivity substrates (quartz, fused silica), because a substantial amount (>70%) of power is being dissipated in the thin photoemissive layer. For continuous laser illumination with a laser power P focused in a spot diameter d on a substrate with thermal conductivity κ, the temperature rise is proportional to P/κd. Here we neglect the heat conduction through the photoemissive metal layer due to its small thickness (~15 nm). For example, using a fused silica substrate with a thermal conductivity of 0.014 W/cm K and an absorbed laser power of 20 mW focused into a 0.5 μm spot, the temperature rises ~4200 K at the location of the focused laser spot. This temperature rise is high enough to cause local melting of the gold layer, induce morphological changes, and alter the surface of the photocathode.

One possibility for increasing the thermal dissipation capacity of the cathode is to use a higher thermally conductive substrate, e.g., sapphire, which is readily available and has a thermal conductivity of 0.36 W/cm K; this would result in a 26 times smaller temperature increase. However, sapphire is birefringent and a specific choice of crystal orientation may be needed to achieve submicron spot sizes. Ultimately, a natural or CVD diamond substrate may be needed. Diamond is optically clear in the UV range and has a thermal conductivity of 20 W/cm K, which is more than 3 orders of magnitude greater than fused silica; this results in a negligible temperature rise.

Assuming that the source angle $\alpha_0$ can be approximated as $$\alpha_0 = \sqrt{\frac{\Delta E_{tr}}{E}} \approx \sqrt{\frac{\Delta E}{E}}$$

the required laser power P $$P \propto \frac{I_0}{(\Delta E)^2} = \beta_i \frac{\pi^2 d_0^2}{4(\Delta E)E}$$

can be minimized through a careful choice of electron-optical parameters.

A significant reduction of the laser power can be achieved by employing higher quantum efficiency cathodes, i.e., magnesium or $Cs_2Te$ or GaAs based negative electron affinity (NEA) photocathodes, though both may require relatively high vacuums and periodic recesiation of the photocathode surface.

In summary, basic conclusions can be drawn for the column design. Lithographic print quality and throughput requirements determine the brightness. The image angle $\alpha$, could be theoretically increased; however, due to geometric and chromatic aberrations of the objective lens, it is expected to reach no more than 10 mrad. An increase in beam energy E above 50 keV would decrease the required laser power, but increased substrate heating and reduced resist sensitivity would become problems. An increase in energy spread $\Delta E$, due to a lower work function hv or larger photon energy $\phi$, will reduce the required laser power due to the increase in quantum efficiency. Nevertheless, the energy spread should not increase above ~1 eV, because the chromatic aberration and therefore the beam spot size at the substrate increases.

Additionally, Fowler's approximation becomes inaccurate for large $\Delta E$, resulting in a smaller than expected increase in quantum efficiency. Due to its quadratic dependence, the most effective way to reduce the laser power is to decrease the laser spot size $d_0$. A smaller laser spot size allows a smaller demagnification ratio, which minimizes the fraction of the electron beam cut by the aperture. Smaller spot sizes can be achieved by utilizing shorter wavelength lasers or by patterning the photocathode, therefore confining the emission to a smaller spot. In the optimum case, when the brightness of the source matches the beam brightness required at the substrate, all electrons pass through the column and the source is self-aperturing.

Electron Optics—Cesium Telluride Photocathode

As noted above, the photocathode 118 may be implemented as a cesium telluride photocathode. In particular, the photocathode may include a cesium telluride layer 500 (FIG. 5A–FIG. 5C), as will be explained in greater detail below. Certain embodiments may also include a cesium bromide layer (e.g., 5–10 nm) applied to the top of the cesium telluride layer. Cesium telluride ($Cs_2Te$) is a compound semiconductor with a bandgap of 3.3 eV and an electron affinity of 0.2 eV. It can produce a high QE (about 10%) when irradiated with 5 eV photons (240 nm) and has an energy spread of about 1.5 eV. In typical operation, photons in the wavelength range of about 200 to about 300 nm are applied.

Figure 5A:
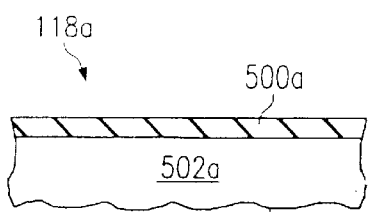
FIGS. 5A–5C illustrate exemplary photocathodes according to embodiments of the present invention.
Figure 5B:
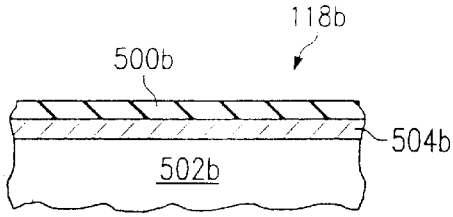
Figure 5C:
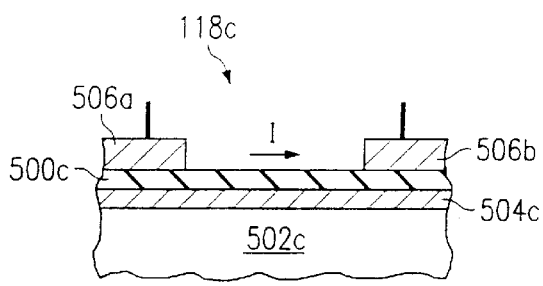

Exemplary cesium telluride photocathodes for use in an electron gun according to embodiments of the present invention are shown in FIGS. 5A–5C. The photocathode 118a of FIG. 5A includes a cesium telluride layer 500a grown on a transparent substrate 502a such as sapphire. A photocathode 118b as shown in FIG. 5B includes a cesium telluride layer 500b, a substrate 502b, and a metallic layer 504b interposed between the cesium telluride layer and the substrate. The metallic layer 504b may be implemented as any semi-transparent metal, such as molybdenum, titanium, or platinum. In this case, current is carried by the metal layer up to the emission sites.

One advantage of using cesium telluride as a photocathode material is that its QE (quantum efficiency) is relatively insensitive to vacuum contaminants. However, over extended periods, the QE of cesium telluride has been shown to degrade due to exposure to background gases. This degradation may be reversed in a variety of ways.

According to one such method, the cesium telluride is heated, for example, to 100 degrees Celsius by applying a current in the plane of the film. Such an embodiment of a photocathode 118c is shown in FIG. 5C. The photocathode 118c includes a cesium telluride layer 500c, a metal layer 504c, and a substrate 502c. In addition, contacts 506a, 506b are provided, to apply a current I to the plane of the film and heat the film during one or more regeneration cycles, thereby recovering QE degradation.

Figure 6:
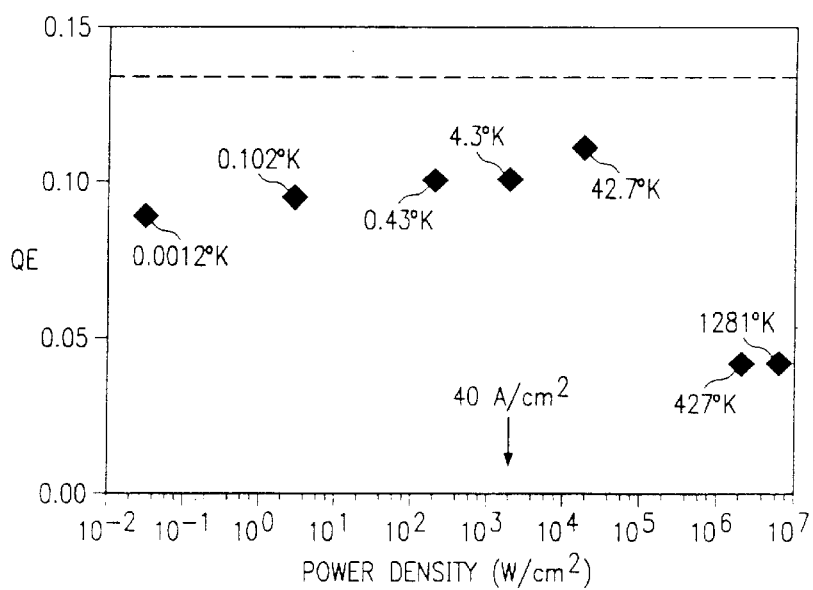
FIG. 6 is a graph of QE vs. power density for a photocathode according to an implementation of the invention.

However, this method may be disadvantageous in that it requires the additional electrodes to supply the current. One aspect of the present invention, therefore, is the recovery of QE by exposing the photocathode to an intense electromagnetic beam, such as the exposing laser itself, typically operating in the ultraviolet range. As shown in FIG. 6, a cesium telluride photocathode can be exposed to a power density of $10^7$ Watts per square centimeters and still maintain a QE above 4%. Moreover, because the QE of the cesium telluride photocathode actually increases with power density, at least below a certain threshold, the photocathode can be regenerated using the laser itself. Thus, a regeneration cycle may be provided whereby the laser that is used to cause electron emission in the photocathode is used to also regenerate the photocathode.

Figure 7:
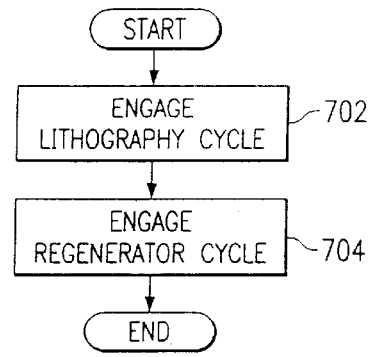
FIG. 7 illustrates a process according to an implementation of the invention.

This process is shown with reference to FIG. 7. As shown, a lithography cycle 702 is implemented under control of the controller (FIG. 1). According to one implementation of the invention, if the QE of the photocathode is 10%, this is made to occur at a power density of approximately $10^4$ Watts per square centimeter. Once QE has degraded to a predetermined degree, a regeneration cycle 704 is implemented. According to one implementation, the regeneration cycle is done at a power density of $10^4$–$10^6$ Watts per square centimeter at a wavelength of approximately 257 nanometers. The substrate temperature is raised about 20–200 degrees Celsius above room temperature.

Writing Strategy

Figure 8:
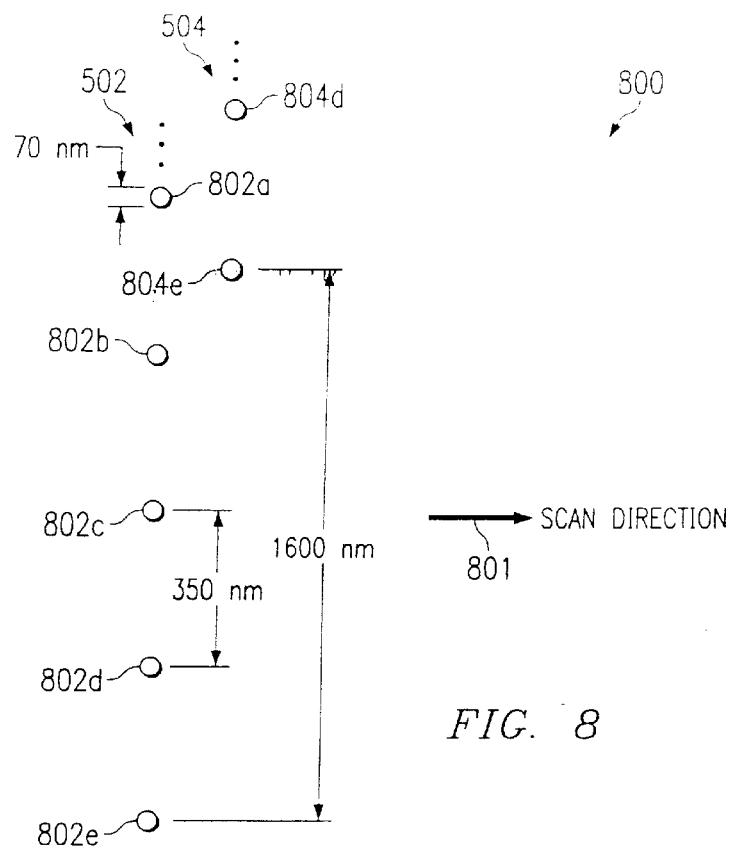
FIG. 8 and FIG. 9 illustrate an interlaced writing strategy according to an embodiment of the present invention.
Figure 9:
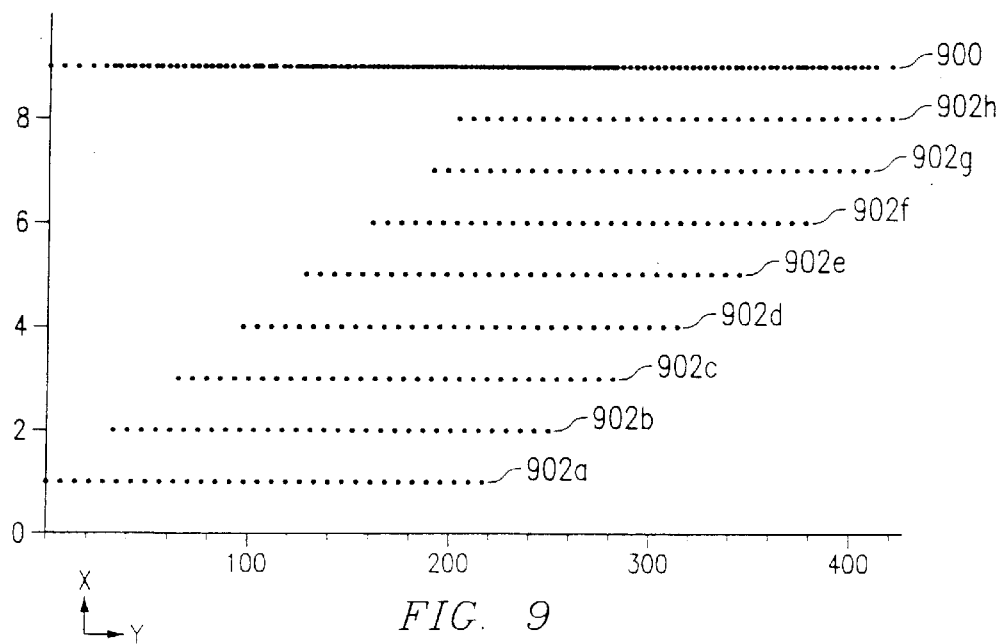

As noted above, an aspect of the present invention is an improved writing strategy. FIG. 8 and FIG. 9 illustrate the interlaced scan strategy. Shown in FIG. 8 is a portion of the leading edge of the brush. More particularly, the first five (5) beams 802a–802e of the brush are shown for clarity. The beams 802*a*–802*e* are separated by 350 nm in the low magnification case and by 210 nm in the high magnification case. The brush is scanned in the direction perpendicular to the array 801. By the next scan, the stage has moved by 1600 nm in the low magnification case and by 960 nm in the high magnification case.

More particularly, FIG. 9 illustrates beam interlacing in greater detail. Shown are a plurality of offset brush lines 902*a*–902*h* and the single continuous line 900 formed therefrom. The offset brush settings 902*a*–902*h* fill in the continuous line in the Y direction while forming lines in the x direction. The numbers in Table 1 represent spacings between the beams in the y direction.

As shown in the table, after 6 scans a contiguous region of scan lines separated by 50 nm begins to be filled in. Table 2 shows the separation between adjacent scan lines after 6 scans. As more scans are added this uniform region grows in extent.

TABLE 2

7,7,4,3,4,3,4,3,4,3,4,3,1,3,3,1,3,3,1,3,3,1,3,3,1,3,1,2,1, 3, 1,2,1,3, 1, 2,1,3,
1,2, 1,3, 1,2, 1, 1,2, 1,2, 1, 1, 2, 1,2,1,1, 2, 1,2, 1,1, 2, 1,2,1, 1,2, 1,1,1, 1, 1,
2,1, 1,1, 1, 1,2, 1, 1, 1, 1, 1,2,1,1,1, 1,1,2,1,1, 1,1, 1,1,1, 1, 1,1, 1, 1, 1, 1, 1,
1, 1,1, 1,1,1, 1, 1,1, 1, 1,1,1, 1, 1,1, 1,1,1, 2, 1, 1,2,1,2, 1,1,2, 1,2, 1,1,2,1,2,
1, 1,2,1, 3,1, 2,1,3, 1,2, 1,3,
3,1,2,1,3,1,3,3,1,3,3,1,3,3,1,3,3,1,3,4,3,4,3,4,3,4,3,4,7,7,7,7

There are only selected combinations of number of beams, beam separation, and stripe brush increment that will yield a uniformly filled in region. The examples of brush parameters given in Table 1 are examples but are not completely unique. The variable demagnification and focus capability in the electron column could be used to make a brush that minimizes e—e position errors for a given throughput.

Another method for interlaced scanning is described in greater detail in co-pending U.S. patent application Ser. No. 09/273,115, titled "Laser Pattern Generator," which is hereby incorporated by reference in its entirety as if fully set forth herein. Another feature of the scanning strategy is to arrange the direction of the sound field in the AOM, as imaged on the writing surface, to be in the opposite direction as the scan velocity. This improves the sharpness of the modulated edges.

Beam Alignment

Aligning the light-optical system to the electron-optical system is challenging. The optical axis of the final light optical reduction lens should be perpendicular to the photocathode and the separation between the two set to high accuracy. This lens must also be aligned to the axis of the first lens of the electron optical column and to the incident light beams. The incident light beams should also be perpendicular to the photocathode.

Figure 11:
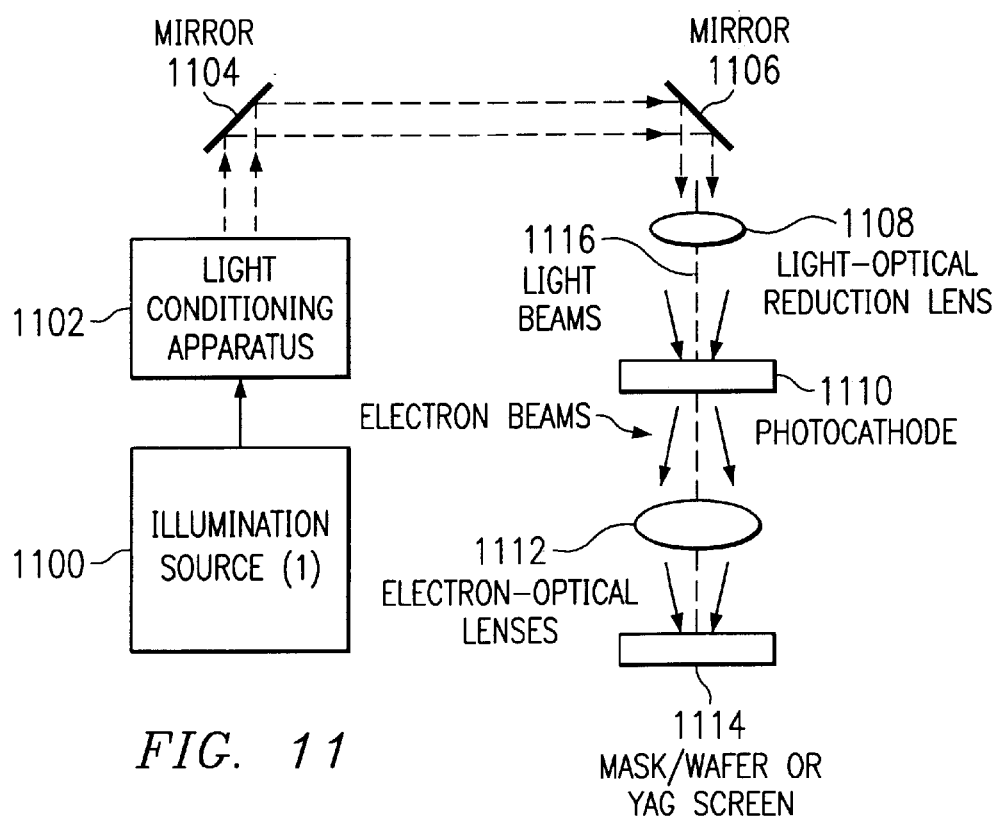
FIG. 11 is a simplified diagram of a lithography tool.

One method for aligning the light optical system to the optic axis of the column is shown with reference to FIG. 11. More particularly, shown in FIG. 11 is a simplified diagram of a photocathode driven multiple beam lithography tool. The tool includes an illumination source 1100, a light conditioning apparatus 1102, mirrors 1104, 1106, a light optical reduction lens(es) 1108, a photocathode 1110, electron-optical lenses 1102, and a mask or wafer substrate 1114.

In operation, the light from the illumination source 1100 is split into multiple beams by the light conditioning apparatus 1102 (e.g., one or more acousto-optical modulators). The light conditioning apparatus 1102 also varies the intensity of each beam and individually blanks the beams, as described above, thereby creating an array of individually blanked and intensity modulated beams. It is noted, however, that other methods may be used to generate this array, such as a separate laser diode for each beam, controlled individually.

The mirrors 1104, 1106 direct the array into the reduction lens 1108. Position adjustments on the mirrors 1104, 1106 allow the array to be shifted in position and angle with respect to the reduction lens 1108. The photocathode 1110 is maintained at a relatively high negative voltage. The reduction lens 1108 is mounted relatively close to the cathode 1110, making electrical isolation problematic. Consequently, it is often advantageous to connect the reduction lens 1108 to the cathode potential. However, this can cause problems in alignment since the reduction lens must be moved while at high voltage.

As such, the following alignment scheme may be used to align the column: First, the reduction lens 1108 is removed and the "raw" beam is aligned to the electron-optical axis 1116 of the column. This is done by wobbling the first lens in the column (oscillating the lens strength above and below focus) and moving the position of the light beam on the photocathode until the defocus of the electron beam is greater than its shift in position. This position is noted for later comparison using the imaging capability of the column.

Second, the incident beam is adjusted so that it is normal to the surface of the photocathode 1110 while still impinging on the photocathode 1110 at the same position. This is done by adjusting the mirrors 1104, 1106 until the separation of the reflection from the photocathode 1110 and the incident beam at some specified distance from the photocathode 1110 is smaller than a specified distance. These two distances may be used to calculate the angle between the incident and reflected beams. It is noted that these two steps may be reversed.

Finally, the reduction lens 1108 is re-inserted and its position and angle are adjusted until the beam reflected from the lens is aligned to the incident beam and the spot on the cathode 1110 is coincident with the position determined in the first step. If the required angle accuracy cannot be obtained using reflections from the lens, an optical flat may be placed on the lens barrel to aid in this alignment. Alignment of the demagnified light beam may be further refined by moving the spot on the cathode while wobbling the first electron lens, then repeating the second step.

The invention described in the above detailed description is not intended to be limited to the specific form set forth herein, but is intended to cover such alternatives, modifications and equivalents as can reasonably be included within the spirit and scope of the appended claims.

What is claimed is:

1. A system, comprising:

a laser adapted to generate a light beam;

a beam splitter for splitting said laser beam into a plurality of light beams;

one or more acousto-optical modulators (AOM) for varying an intensity of said light beams;

a photocathode adapted to emit electron beams responsive to said light beams; and an electron beam column adapted to demagnify said electron beams and scan said electron beams across a writing plane.

2. A system in accordance with claim 1, wherein an intensity of said electron beams is varied by varying said intensity of said light beams.

3. A system in accordance with claim 2, wherein said electron beams are scanned across said writing plane in an interlaced fashion.

4. A system in accordance with claim 2, wherein said intensity of said light beams is independently varied.

5. A method for generating patterns on a workpiece, comprising:

generating a light beam;

splitting said light beam into a plurality of light beams;

modulating an intensity of said plurality of light beams;

applying modulated light beams to a photocathode to generate a plurality of electron beams; and demagnifying said plurality of electron beams in an electron column.

6. A method according to claim 5, comprising:

modulating an intensity of said electron beams at a workpiece by modulating said intensity of said light beams.

7. A method in accordance with claim 6, further comprising scanning said electron beams across a workpiece surface in an interlaced fashion.

8. A method in accordance with claim 6, wherein intensities of said plurality of electron beams are individually modulated by individually modulating intensities of said plurality of light beams.

9. A method, comprising:

providing a laser for generating a laser beam;

providing at least one beam splitter for splitting said laser beam into a plurality of beams;

providing at least one acousto-optical modulator for modulating intensities of said plurality of beams; and providing a photocathode in a path of said plurality of beams for generating electron beams.

10. A method in accordance with claim 9, further comprising providing an electron column for demagnifying said plurality of electron beams.

11. A method in accordance with claim 10, wherein said electron beams are adapted to be modulated by modulating said light beams.

12. A method according to claim 11, further comprising providing a controller adapted to control implementation of an interlaced writing scheme using said electrons beams.

* * * * *